United States Patent
Agarwal et al.

(10) Patent No.: US 10,209,914 B2
(45) Date of Patent: Feb. 19, 2019

(54) SYSTEM AND METHOD FOR DYNAMIC FOLDING OR DIRECT WRITE BASED ON BLOCK HEALTH IN A NON-VOLATILE MEMORY SYSTEM

(71) Applicants: Dinesh Agarwal, Bangalore (IN); Hitesh Golechchha, Bangalore (IN); Guruswamy Ganesh, Santa Clara, CA (US)

(72) Inventors: Dinesh Agarwal, Bangalore (IN); Hitesh Golechchha, Bangalore (IN); Guruswamy Ganesh, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/420,894

(22) Filed: Jan. 31, 2017

(65) Prior Publication Data
US 2018/0217751 A1    Aug. 2, 2018

(51) Int. Cl.
*G06F 3/06* (2006.01)
*G11C 16/10* (2006.01)
*G11C 11/56* (2006.01)

(52) U.S. Cl.
CPC .......... *G06F 3/064* (2013.01); *G06F 3/0616* (2013.01); *G06F 3/0653* (2013.01); *G06F 3/0679* (2013.01); *G11C 11/5628* (2013.01); *G11C 16/10* (2013.01)

(58) Field of Classification Search
CPC ...... G06F 3/064; G06F 3/0653; G06F 3/0616; G06F 3/0679; G11C 11/5628; G11C 16/10
See application file for complete search history.

(56) References Cited

U.S. PATENT DOCUMENTS

| | | | | |
|---|---|---|---|---|
| 2011/0302477 A1* | 12/2011 | Goss | ............... | G06F 11/1068 714/773 |
| 2012/0226963 A1* | 9/2012 | Bivens | ............... | G11C 29/42 714/773 |
| 2015/0003156 A1* | 1/2015 | Berckmann | ............ | G11C 29/88 365/185.09 |
| 2015/0058591 A1 | 2/2015 | Kaiser et al. | | |
| 2015/0085575 A1* | 3/2015 | Tam | ............... | G11C 29/50004 365/185.11 |
| 2015/0149693 A1* | 5/2015 | Ng | ............... | G06F 3/0619 711/103 |

(Continued)

*Primary Examiner* — Pho M Luu
*Assistant Examiner* — Jerome Leboeuf
(74) *Attorney, Agent, or Firm* — Dickinson Wright PLLC

(57) ABSTRACT

A system and method for managing data writes in a non-volatile memory including SLC and MLC blocks of non-volatile memory and a MLC block health rating data structure tracking relative MLC block health. A controller in the system may be configured to select MLC blocks for receiving host data and then route the host data over a direct MLC write path for healthy blocks, or over a two-step indirect write path that includes a SLC write and a SLC-MLC fold for unhealthy MLC blocks. The method may include assigning a health designation based on BER determined for each MLC block and assigning a direct write number to healthy MLC blocks based on the determined BER that limits the number of program/erase cycles for direct writes for a particular MLC block until a re-assessment of block health is needed.

21 Claims, 11 Drawing Sheets

(56) References Cited

U.S. PATENT DOCUMENTS

2016/0018998 A1   1/2016  Mohan et al.
2016/0148708 A1   5/2016  Tuers et al.
2016/0179406 A1   6/2016  Gorobets et al.
2016/0342344 A1* 11/2016  Kankani ............... G06F 3/0616

* cited by examiner

SYSTEM AND METHOD FOR DYNAMIC FOLDING OR DIRECT WRITE BASED ON BLOCK HEALTH IN A NON-VOLATILE MEMORY SYSTEM

BACKGROUND

Non-volatile memory systems, such as solid state drives (SSDs) including NAND flash memory, are commonly used in electronic systems ranging from consumer products to enterprise-level computer systems. The performance of lower density (fewer bit per cell) non-volatile memory is often better than that of higher density non-volatile memory in terms of endurance, but the space and cost advantage of higher density non-volatile memory often leads to SSDs including both types of memory. The greater endurance of lower density memory, such as single level cell (SLC) memory with a single bit per cell capacity, may suggest that initial host writes should be directed to SLC before later being written from the SLC to a multi-level cell (MLC) memory with multiple bit per cell capacity in a process referred to a folding. There are speed advantages, however, to directly writing host data to the MLC memory and avoiding the extra write step of first writing host data to SLC memory and then folding the data from several SLC blocks into a MLC block. The tradeoff, however, is that by skipping the typical path of a first write into SLC and then a fold from SLC into MLC, there is less write failure protection. An initial write into SLC before folding into MLC means that there is a temporary copy of the correct data in SLC if an error occurs in the SLC to MLC folding step. Although various forms of data protection encoding may be used to protect data from errors in a direct MLC write situation, there may be a performance cost due to the extra processing necessary to generate the error correction data.

DETAILED DESCRIPTION

Figure 1A:
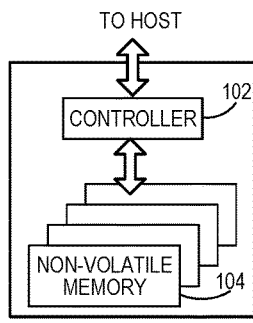
FIG. 1A is a block diagram of an example non-volatile memory system.

A system and method for managing host data writes through dynamic folding or direct write operations based on block health in a non-volatile memory system is disclosed. The system and method, to reduce the chance of a write error due to health of an MLC block, may predict whether a MLC block is healthy and then utilize that MLC block for direct writes for a limited period of time before re-checking the health of that block. When a MLC block is determined not to be sufficiently healthy, the block may be identified for use with less risky fold writes from SLC rather than for direct MLC writes. Health of a MLC block may be divided up into a finer granularity determination than a binary healthy or unhealthy categorization, and that finer granularity categorization may be used to further differentiate treatment of blocks in each of the healthy or unhealthy block categories. For example, finer differences between the health of healthy blocks may be used to assign different numbers of direct write cycles to those healthy blocks, where the number of direct write cycles relate to program/erase cycles permitted for the block before again checking the health of the block.

According to one aspect, a method for managing writes to blocks in a non-volatile memory system is described. The method may include receiving data for storage in a non-volatile memory having single bit per cell capacity blocks and multiple bit per cell capacity blocks and determining if a multiple bit per cell capacity block in the non-volatile memory meets a health criterion. When the multiple bit per cell capacity block meets the health criterion, the method includes directly writing the received data to the multiple bit per cell capacity block. When the multiple bit per cell capacity block does not meet the health criterion, the method includes writing the received data into a single bit per cell capacity non-volatile memory block and into the multiple bit per cell capacity block. In different implementations, the health criterion may be based on bit error rate (BER) measured for a block and, in some further implementations, blocks determined to be unhealthy based on a predetermined BER threshold may be sub categorized by portion so that healthy portions of the block may be written to directly, and unhealthy portions of the same block may be written to in a multi-step write.

In one variation of the method, for a write to an unhealthy multiple bit per cell capacity block, the writing of the received data into the single bit per cell capacity block occurs first and then the data is later written from that single bit per capacity block to the multiple bit per cell capacity block. In an alternative variation, the writing of the data to the single bit per cell capacity block and the multiple bit per cell capacity block is done concurrently such that separate direct writes of the received data are performed to both types of cells essentially in parallel. In both variations, a back-up copy of the data is present in the single bit per cell capacity block that may be used to recover data if the data write to the multiple bit per cell capacity block is determined to be corrupted or otherwise fails.

In another aspect, a non-volatile memory system includes a non-volatile memory having a plurality of single level cell (SLC) blocks having single bit per cell capacity memory cells, and a plurality of multi-level cell (MLC) blocks having multiple bit per cell capacity memory cells. The system also includes a controller in communication with the non-volatile memory. The controller is configured to write received host data to MLC blocks identified as healthy over a direct MLC write path that bypasses the SLC blocks. The controller is also configured to write received host data to MLC blocks identified as unhealthy over a multi-step write path via an initial write to at least one SLC block, where healthy MLC blocks are those MLC blocks having a health criterion within first predetermined range and unhealthy MLC blocks are those MLC blocks having the health criterion in a second predetermined range different than the first predetermined range. The health criterion may be a BER below a predetermined threshold.

In different implementations, a block health rating data structure may be generated in the non-volatile memory system and the controller may identify healthy and unhealthy blocks in the data structure, including assigning a direct write number or counter to MLC blocks determined to be healthy. The direct write number may be used by the controller to limit the number of direct writes to a particular healthy MLC block until that MLC blocks needs to be re-evaluated for health.

In yet another aspect, a non-volatile memory system is disclosed including a non-volatile memory. The non-volatile memory may include single level cell (SLC) blocks having single bit per cell capacity memory cells, multi-level cell (MLC) blocks having multiple bit per cell capacity memory cells and a block health rating data structure having MLC block health data for at least a portion of the MLC blocks. The non-volatile memory system may also include means for writing received host data to MLC blocks identified as healthy in the block health data structure over a direct MLC write path that bypasses the SLC blocks, and for writing received host data to MLC blocks identified as unhealthy in the block health data structure over a multi-step write path via an initial write to at least one SLC block. The healthy MLC blocks may be MLC blocks having a health criterion within first predetermined range and unhealthy MLC blocks may be MLC blocks having the health criterion in a second predetermined range different than the first predetermined range.

Referring now to FIG. 1A, a block diagram illustrating a non-volatile memory system is shown. The non-volatile memory (NVM) system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, one or more microprocessors or processors (also referred to herein as central processing units (CPUs)), and a computer-readable medium that stores computer-readable program code (e.g., software or firmware) executable by the (micro)processors, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. For purposes of this disclosure, the term MLC is used herein to refer to memory cells with a two or more bit per cell capacity, such that TLC memory is therefore a subset of MLC specific to a three bit per cell capacity. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A NVM system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
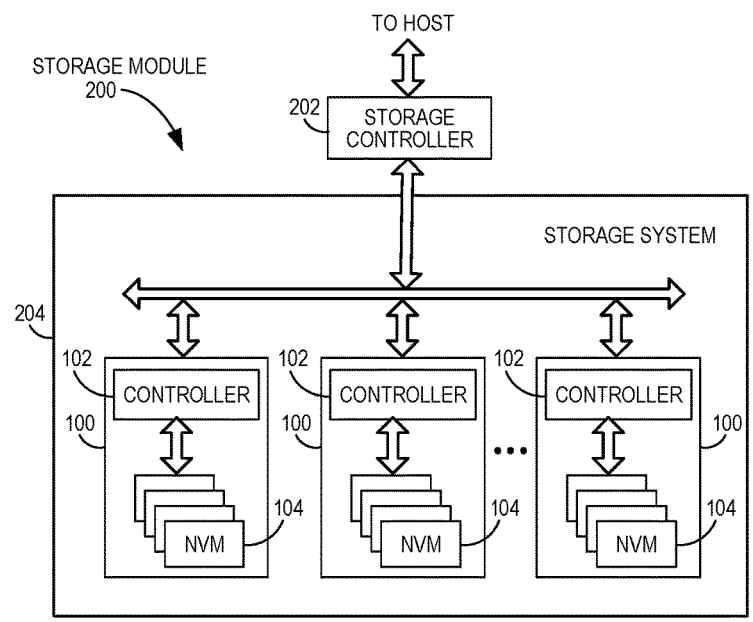
FIG. 1B is a block diagram illustrating an exemplary storage module.

FIG. 1B illustrates a storage module 200 that includes plural NVM systems 100. As such, storage module 200 may include a storage controller 202 that interfaces with a host and with storage system 204, which includes a plurality of NVM systems 100. The interface between storage controller 202 and NVM systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
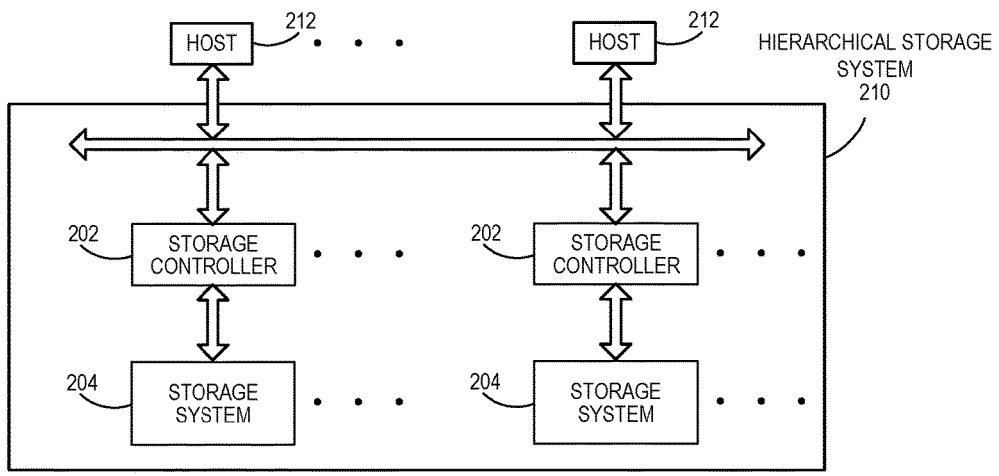
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
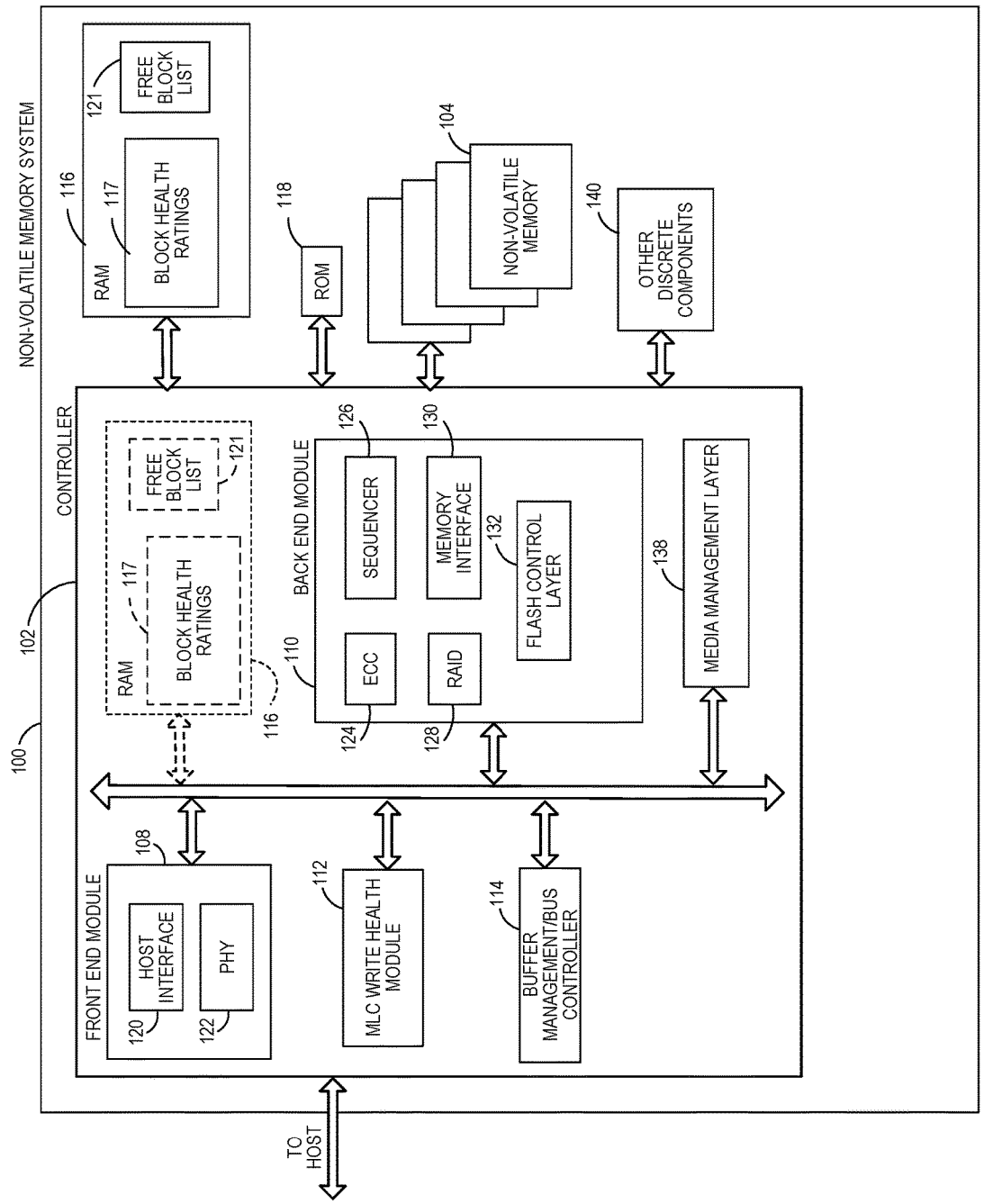
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a MLC write health module 112 present on the die of the controller 102. As described below, the MLC write health module 112 may provide functionality for determining a health of MLC blocks in the non-volatile memory 104 and routing data from a host directly to MLC blocks or first to SLC blocks and then folding to MLC blocks based on the determined MLC block health. The MLC write health module 112 of the controller 102 may accomplish this by tracking bit error rate (BER) for MLC blocks at certain intervals and assigning a health level to the MLC block, where a healthy MLC block may be directly written to for a certain number of cycles before being rechecked for health and a less healthy MLC block may only be written to via a folding process from SLC blocks.

A buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller. Further, in some implementations, the controller 102, RAM 116, and ROM 118 may be located on separate semiconductor die.

The RAM 116 in the NVM system 100, whether outside the controller 102, inside the controller or present both outside and inside the controller 102, may contain a number of items, including a copy of one or more pieces of the logical-to-physical mapping tables for the NVM system 100. The RAM 116 may contain block health ratings 117, as further described below, for each of the MLC blocks of non-volatile memory. The RAM 116 may also include a free block list 121 indicating currently unused physical blocks available for use in the non-volatile memory 104.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the NVM system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of NVM system 100 illustrated in FIG. 2A include the media management layer 138, which performs wear leveling of memory cells of non-volatile memory die 104 and manages mapping tables and logical-to-physical mapping or reading tasks. NVM system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
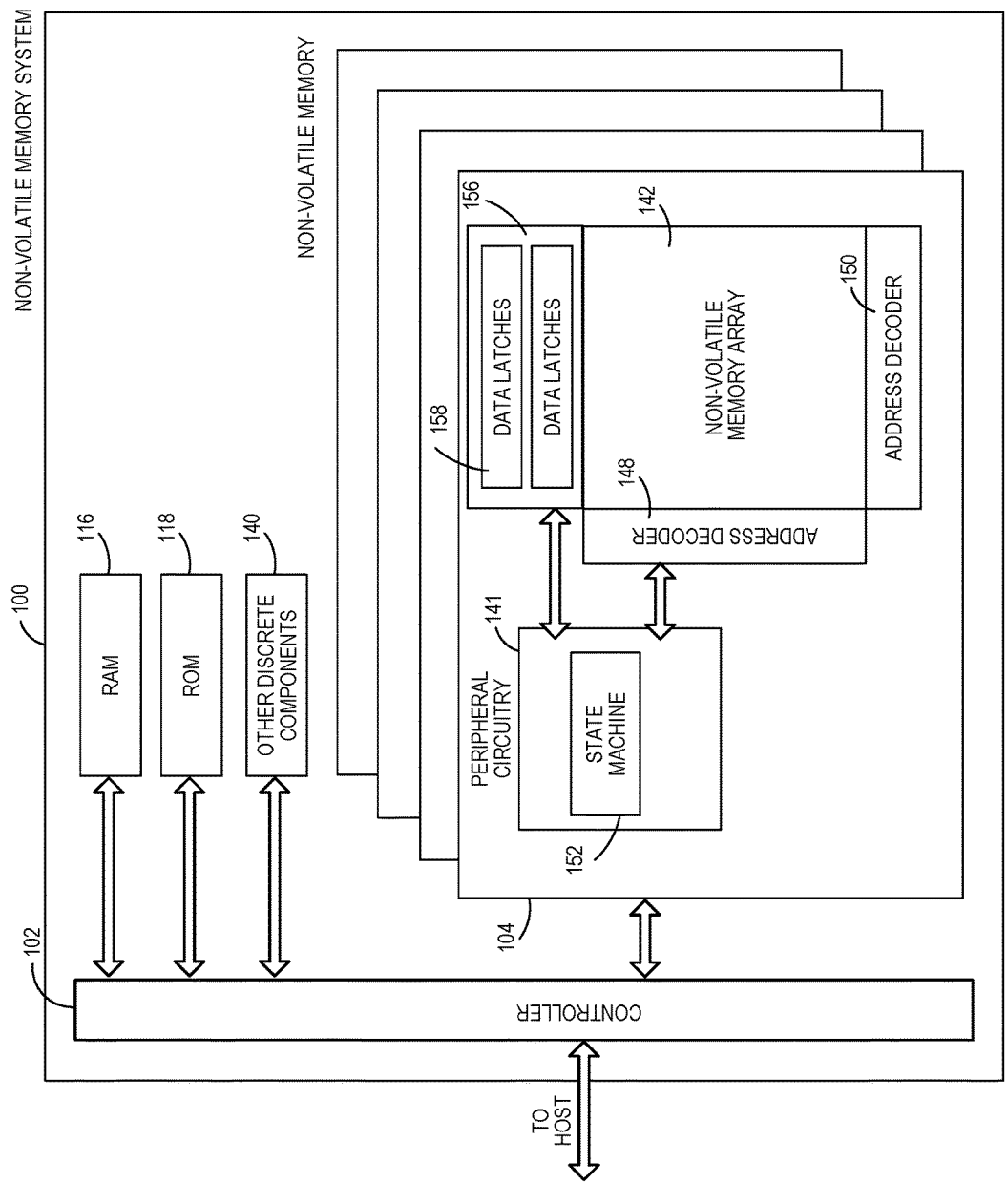
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two-dimensional and/or three-dimensional configuration. Peripheral circuitry 141 includes a state machine 152 that provides status information to controller 102. Non-volatile memory die 104 further includes a data cache 156 that caches data being read from or programmed into the non-volatile memory cells of the non-volatile memory array 142. The data cache 156 comprises sets of data latches 158 for each bit of data in a memory page of the non-volatile memory array 142. Thus, each set of data latches 158 may be a page in width and a plurality of sets of data latches 158 may be included in the data cache 156. For example, for a non-volatile memory array 142 arranged to store n bits per page, each set of data latches 158 may include N data latches where each data latch can store 1 bit of data.

In one implementation, an individual data latch may be a circuit that has two stable states and can store 1 bit of data, such as a set/reset, or SR, latch constructed from NAND gates. The data latches 158 may function as a type of volatile memory that only retains data while powered on. Any of a number of known types of data latch circuits may be used for the data latches in each set of data latches 158. Each non-volatile memory die 104 may have its own sets of data latches 158 and a non-volatile memory array 142. Peripheral circuitry 141 includes a state machine 152 that provides status information to controller 102. Peripheral circuitry 141 may also include additional input/output circuitry that may be used by the controller 102 to transfer data to and from the latches 158, as well as an array of sense modules operating in parallel to sense the current in each non-volatile memory cell of a page of memory cells in the non-volatile memory array 142. Each sense module may include a sense amplifier to detect whether a conduction current of a memory cell in communication with a respective sense module is above or below a reference level.

The non-volatile flash memory array 142 in the non-volatile memory 104 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock.

Figure 3:
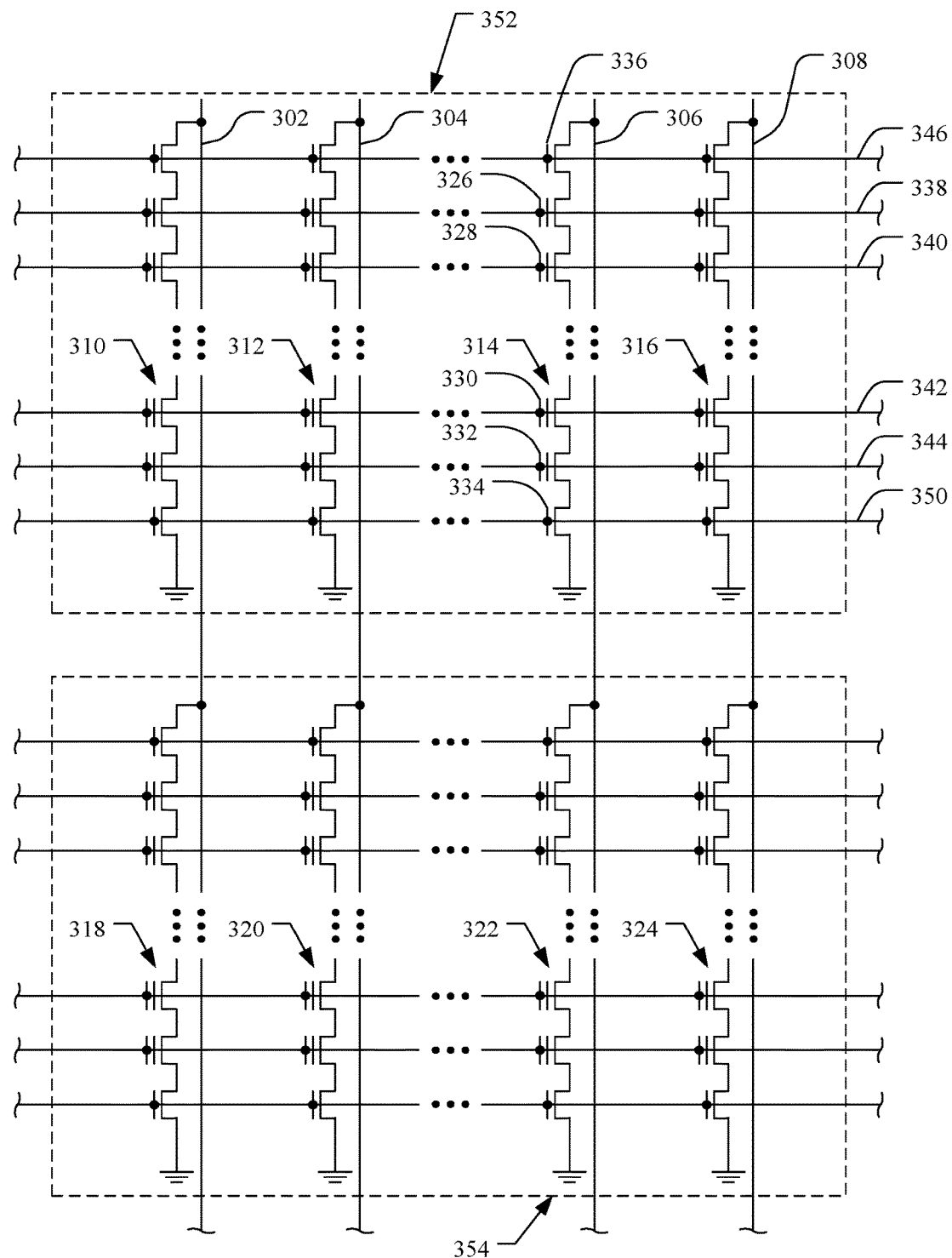
FIG. 3 is an example circuit diagram of a non-volatile memory array illustrating one possible arrangement of word lines and blocks.

An example NAND array is illustrated in FIG. 3. While a large number of global bit lines are provided in a NAND array, only four such lines 302-308 are shown in FIG. 3 for simplicity of explanation. A number of series connected memory cell strings 310-324 are connected between one of these bit lines and a reference potential. Using the memory cell string 314 as representative, a plurality of charge storage memory cells 326-332 are connected in series with select transistors 334 and 336 at either end of the string. When the select transistors of a string are rendered conductive, the string is connected between its bit line and the reference potential. One memory cell within that string is then programmed or read at a time.

Word lines 338-344 of FIG. 3 individually extend across the charge storage element of one memory cell in each of a number of strings of memory cells, and gates 346 and 350 control the states of the select transistors at each end of the strings. The memory cell strings that share common word and control gate lines 338-350 are made to form a block 352 of memory cells that are erased together. This block of cells contains the minimum number of cells that are physically erasable at one time. One row of memory cells, those along one of the word lines 338-344, are programmed at a time.

Conventionally, the rows of a NAND array are programmed in a prescribed sequential order, in this case beginning with the row along the word line 344 closest to the end of the strings connected to ground or another common potential. The row of memory cells along the word line 342 is programmed next, and so on, throughout the block 352.

A second block 354 is similar, its strings of memory cells being connected to the same global bit lines as the strings in the first block 352 but having a different set of word and control gate lines. The word and control gate lines are driven to their proper operating voltages by row control circuits. If there is more than one plane in the system, one memory architecture uses common word lines extending between them. There can alternatively be more than two planes that share common word lines. In other memory architectures, the word lines of individual planes are separately driven.

While the example NAND array illustrated in FIG. 3 has been used to describe a process for writing data to a memory block in a forward direction, to write data to a memory block in either a forward direction or a reverse direction, a controller may change which end of the memory cell strings is connected is connected a ground or other common potential.

Figure 4:
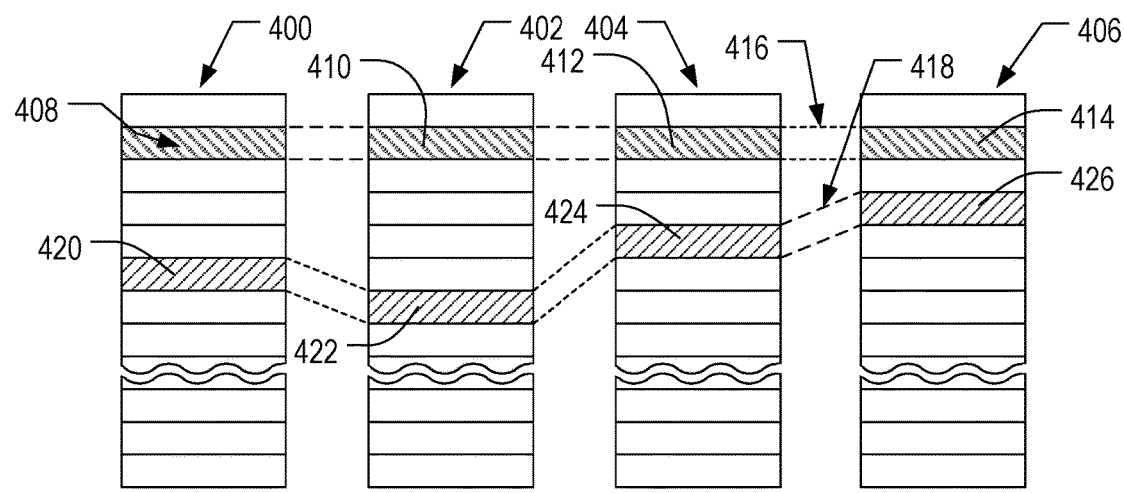
FIG. 4 illustrates an example physical memory organization of the non-volatile memory system of FIG. 1A.

Referring to FIG. 4, another conceptual illustration of a representative flash memory cell array is shown. Four planes or sub-arrays 400, 402, 404 and 406 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells, shown in FIG. 3 by rectangles, such as blocks 408, 410, 412 and 414, located in respective planes 400, 402, 404 and 406. There may be dozens or hundreds of blocks in each plane. Blocks may be logically linked together to form a metablock that may be erased as a single unit. For example, blocks 408, 410, 412 and 414 may form a first metablock 416. The blocks used to form a metablock need not be restricted to the same relative locations within their respective planes, as is shown in the second metablock 418 made up of blocks 420, 422, 424 and 426.

Figure 5:
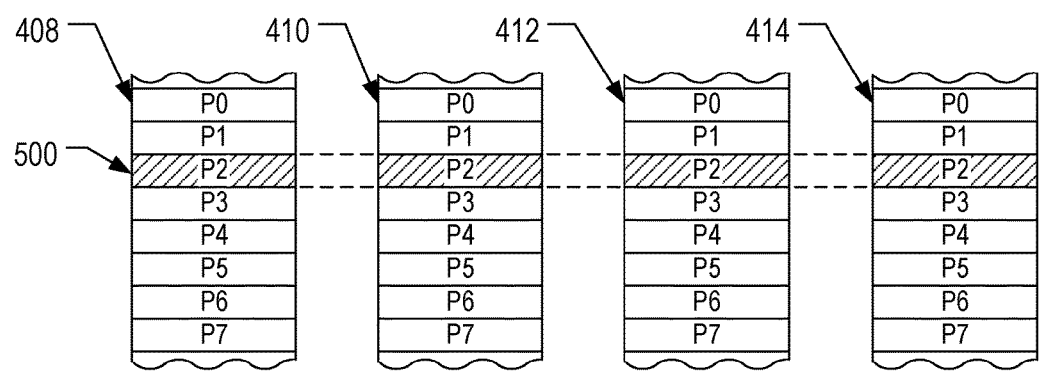
FIG. 5 shows an expanded view of a portion of the physical memory of FIG. 4.

The individual blocks are in turn divided for operational purposes into pages of memory cells, as illustrated in FIG. 5. The memory cells of each of blocks 408, 410, 412 and 414, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 500 is illustrated in FIG. 4 as formed of one physical page for each of the four blocks 408, 410, 412 and 414. The metapage 400 includes the page P2 in each of the four blocks but the pages of a metapage need not necessarily have the same relative position within each of the blocks. A metapage is typically the maximum unit of programming, although larger groupings may be programmed. The blocks disclosed in FIGS. 4-5 are referred to herein as physical blocks because they relate to groups of physical memory cells as discussed above. As used herein, a logical block is a virtual unit of address space defined to have the same size as a physical block. Each logical block may include a range of logical block addresses (LBAs) that are associated with data received from a host. The LBAs are then mapped to one or more physical blocks in the non-volatile memory system 100 where the data is physically stored.

Figure 6:
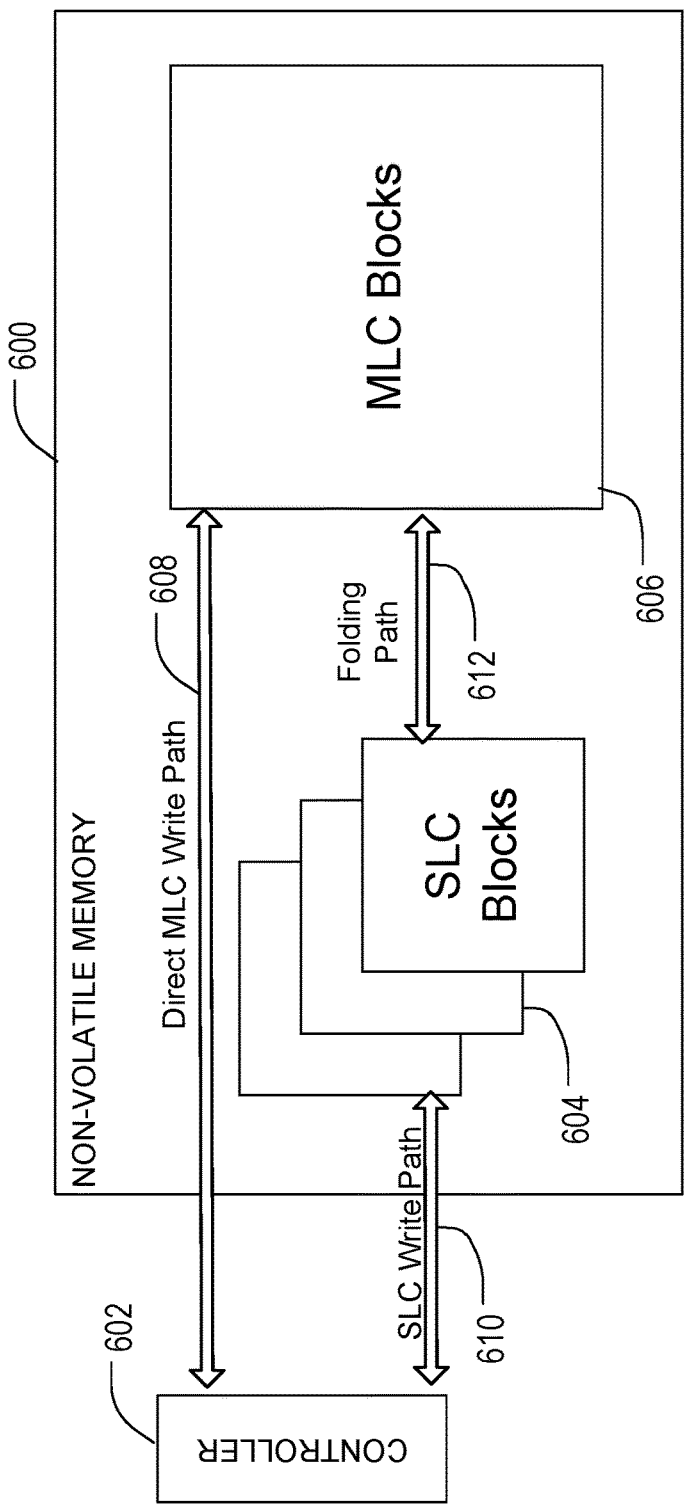
FIG. 6 illustrates a block diagram of the non-volatile memory of FIG. 2A with a direct MLC write path and an indirect, two-step write path that includes an SLC write path and folding path from SLC to MLC.

As noted above, there may be different types of memory blocks in the non-volatile memory 104, SLC and MLC for example. Each non-volatile memory die in the non-volatile memory may include only one memory block type, or a combination memory block types. In the example of FIG. 6, a conceptual illustration of a non-volatile memory 600 (corresponding to non-volatile memory 104 in FIGS. 2A-2B) is shown that includes SLC blocks 604 and MLC blocks 606. Although the triple level cell (3 bit per cell) MLC blocks 606 are shown, any other type or types of MLC blocks with 2 or more bit per cell capacity may be used in other implementations. Different simplified write paths are also illustrated from the controller 602 to the MLC blocks 606. A direct MLC write path 608 is shown where the controller 602 writes data directly into MLC blocks 606, bypassing any intermediate initial write to the SLC blocks. Alternatively, the controller 602 may first direct data writes eventually intended for the MLC blocks 606 to the SLC blocks 604 over an SLC write path 610 and then write that data from the SLC blocks 604 to the MLC blocks 606 in a folding process over a folding path 612. The folding process generally describes the copying of data from multiple single bit per cell SLC blocks 604 into a single MLC block with multiple bits per cell. In the example of FIG. 5, because the multiple bit per cell blocks are MLC, with three bit per cell blocks, the fold process involves taking the data from three SLC blocks 604 and writing them into one MLC block 606.

The routing of data from the host directly to MLC blocks 606, or via a two-step SLC write and SLC to MLC fold operation, is managed by the MLC write health module 112 in the controller 102. An example of the process of the controller determining which write path to use is set forth in FIG. 7. The controller first determines the health of the MLC (in the current example, a 3 bit per cell, sometimes referred to as TLC, version of MLC blocks) blocks (at 702). The health of a block is defined herein as the ability of the MLC block to correctly store and maintain data. In one implementation, the health may be determined by the bit error rate (BER) measured for the block. BER may be measured using any of a number of known BER measurement techniques. For example, the BER for each block may be determined by the ECC engine 124 in the controller by assigning the block the BER of the word line found to have the highest BER in the particular block. The ECC engine 124 may use any of a number of bit error determination techniques, such as using parity bit errors and parity information generally to locate and identify errors. In one example, a healthy MLC block may be any block having a BER less than a predetermined threshold, and a less healthy block may be any block that has a BER greater than the predetermined threshold. If certain word lines in a block exceed the BER threshold, or some memory failures happen on those word lines, then the whole block may be marked unhealthy and may later be divided into zones of good and bad word lines as described in greater detail below. Thus, in one implementation, the decision as to whether a MLC block is healthy or unhealthy may be based on the maximum BER observed in a world line of the block. When it is determined that a word line is bad, for example due to a hard failure of the word line, then the MLC write health module may treat the word line as bad going forward and omit that word line for writing, or alternatively may pad that word line with dummy data during direct writes, so that the bad word line will not contribute towards block BER in future.

Once the health of the blocks 606 is determined, by the BER threshold and/or other health measurement, the controller may divide up the MLC blocks 606 into pools of healthy and less healthy blocks, for example by marking the healthy blocks as healthy in a block health ratings table 117 or other data structure that may be maintained in memory such as RAM 116 (at 704). In one implementation, the first time that data is written to a MLC block 606 that has not had a health determination, the data is always written via a two-step process of a SLC write and a SLC to MLC fold to allow for the write failure backup protection of having the initial SLC write while the BER or other health measurement is made on the particular MLC block.

In subsequent write operations, when MLC blocks 606 that have been determined to be healthy are available, the controller directly writes data over the MLC direct write path to those MLC blocks 606 (at 706). When MLC blocks 606 having a health level less than the predetermined threshold, or that have not had a health determination made, are written to, it is only via the two-step process of the SLC write followed by the fold from SCL to MLC over the fold path (at 708). As described in greater detail below, the MLC blocks determined to be healthy are written to over the direct MLC write path, but are only written to directly for a limited number of program/erase cycles before needing to be re-checked. Accordingly, each MLC block determined to be healthy is assigned a predetermined number of program/erase cycles for direct MLC write path writes before the health of that MLC block is re-checked. When a write operation is destined for a MLC block, if the predetermined number of program/erase cycles has not been exhausted, then the write may be made directly to the MLC block over the direct MLC write path (at 710, 706). However, if the predetermined number of program erase cycles since the last health check has been exhausted, then the controller directs the data first to the SLC blocks 604 and then over the fold path to the previously healthy MLC block 606 while the BER or other health status for the previously healthy MLC block is re-checked (at 712, 704).

Figure 7:
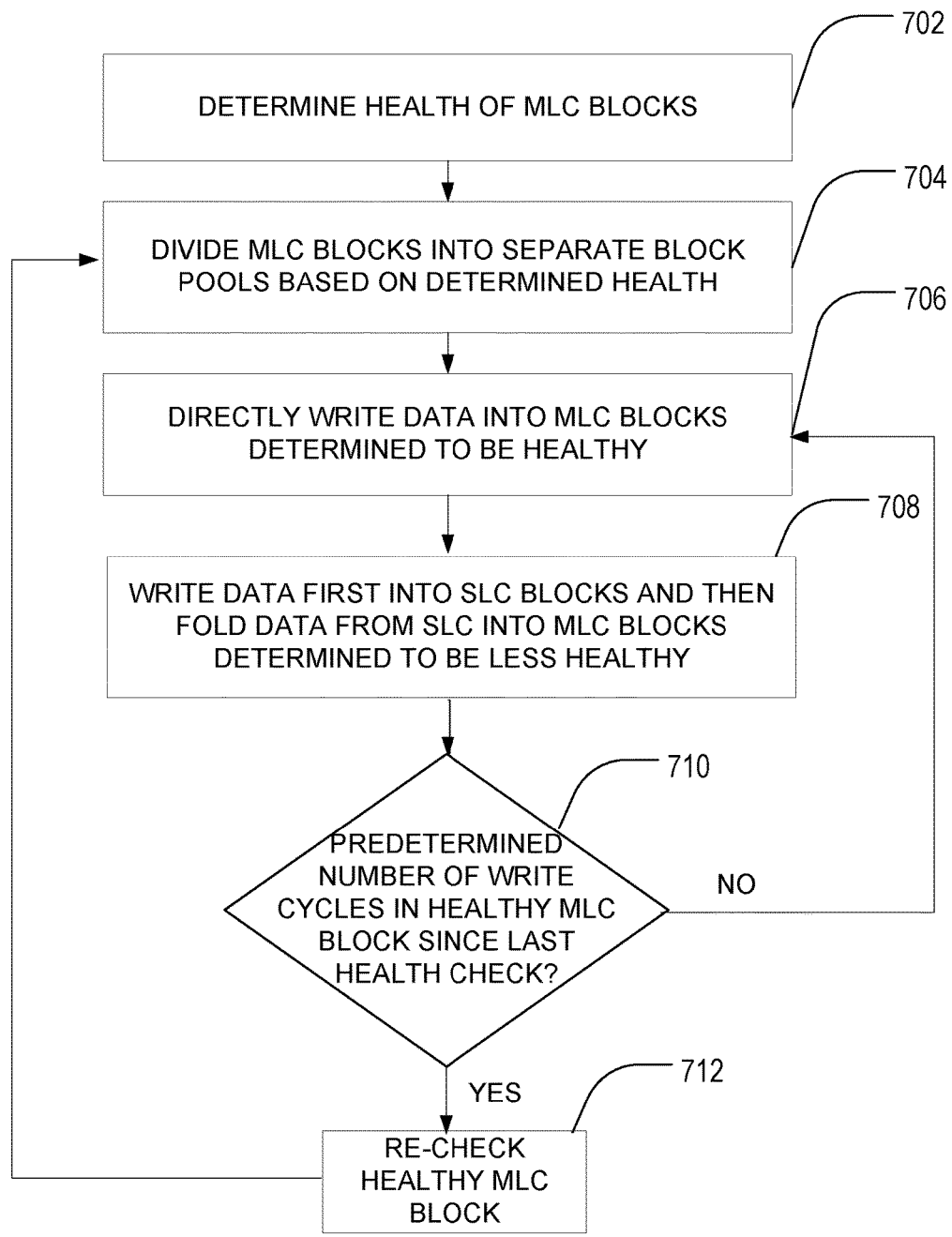
FIG. 7 is a flow diagram illustrating one implementation of managing data routing over different write paths in a non-volatile memory such as shown in FIG. 6.
Figure 8:
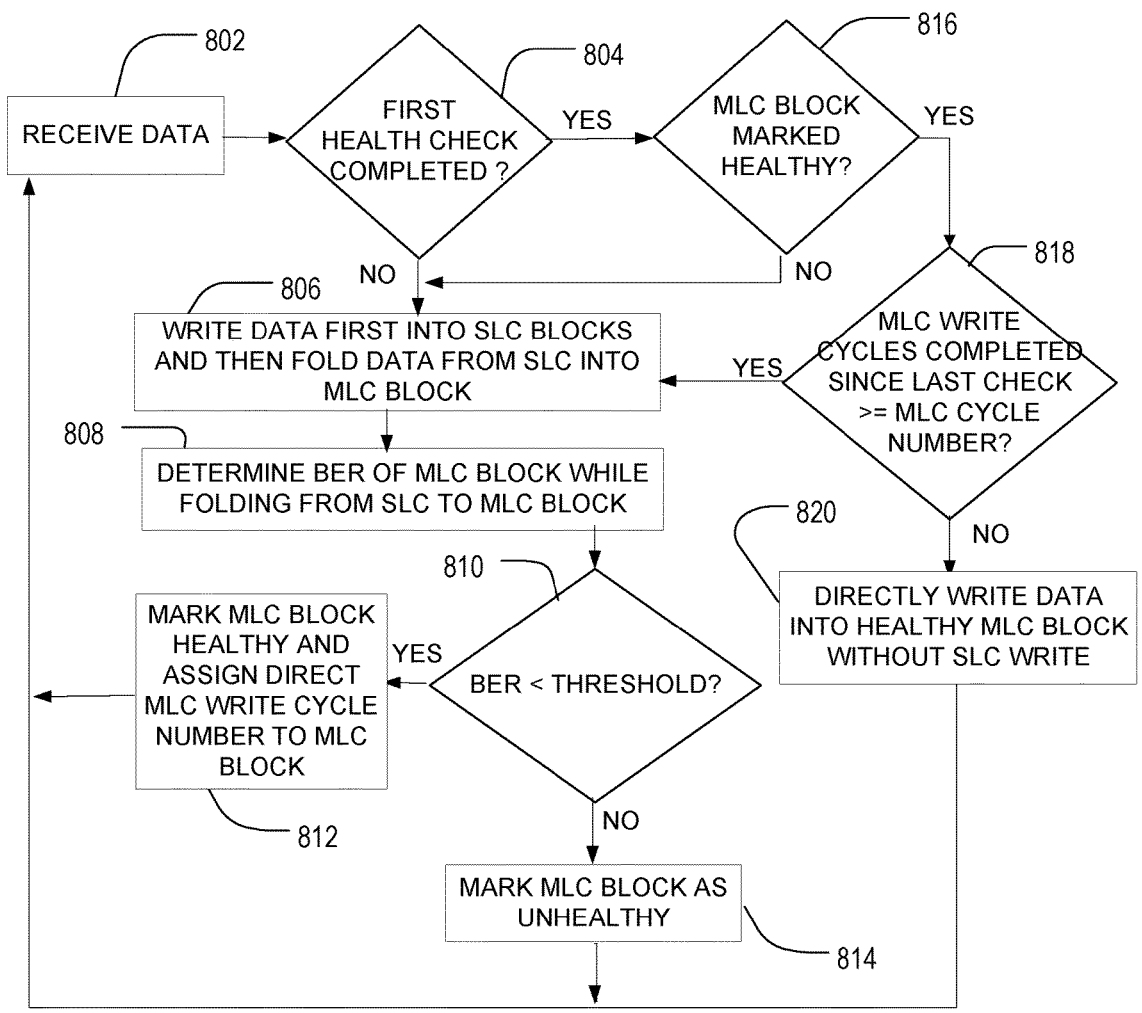
FIG. 8 is a flow diagram of an implementation of the method of FIG. 7.

In one implementation, the controller 102, via the MLC write health module 112, keeps track of all transactions of the health of every MLC block (such as MLC blocks 606) by including a healthy or unhealthy marking in the block health ratings data structure 117 in RAM 116. This data structure 117 may include a program/erase cycle counter that is assigned when the MLC block is first identified as healthy and decremented each time that MLC block is written to. An example of a more detailed version of the process of FIG. 7 is shown in FIG. 8. When data is received that will be written into the MLC blocks of the non-volatile memory, the controller identifies an available MLC block as the destination block for the data (at 802). The controller 102 may then check the block health rating data structure 117 to determine if the particular MLC block has been previously assessed for block health. If the block is unmarked and has had a first health assessment, for example no entry indicating that the block is healthy or unhealthy is found, then that the data received is first written to SLC blocks and then a fold operation is performed to write the data from SLC blocks to the MLC block (at 804, 806). This allows for that MLC block, currently of unknown health, to be treated cautiously in terms of data protection through the SLC write, while also allowing the health criteria of that MLC block, such as BER for that MLC block, to be checked during the fold operation (at 808).

As noted above, in one implementation a predetermined BER threshold may be utilized by the controller 102 via the MLC write health module 112, to sort between healthy blocks and unhealthy blocks. If the MLC block being looked at has a BER less than the predetermined threshold, then it may be marked as healthy and assigned a predetermined number of program/erase cycles for subsequent direct MLC write operations before the health of that MLC block needs to be re-checked. In FIG. 8, if the BER is below the predetermined threshold, the MLC block is marked in the block health ratings data structure and associated with a direct MLC write number in the data structure 117. Subsequently, when data is next received that is to be written to that MLC block (at 802), the controller will see that the block has been marked in the data structure (at 804) and, if it is marked as healthy and the number of direct MLC writes assigned to that MLC block has not occurred, the data will be directly written to the healthy MLC block (at 816, 818 and 820).

For a MLC block that has been marked healthy, the process of directly writing data to that MLC block will repeat until the direct MLC write number has been reached, at which point the controller 102 may then revert to rechecking the health of that formerly healthy MLC block through the same process of first writing data to SLC and then folding the data into the MLC block and obtaining a more current BER status (at 818, 806 and 808). The MLC block being examined may again be determined to be healthy or may be marked as unhealthy depending on the current BER found. In contrast, if a MLC block has been previously marked as unhealthy (at 816) the received data will go through the two-step SLC write and SLC to MLC fold process to provide more protection in case of write errors. In the implementation illustrated in FIG. 8, the process shown includes rechecking the MLC block marked as unhealthy so that there is the possibility it may be brought into healthy block status if its BER improves. In other implementations, it is contemplated that once a MLC block is designated as unhealthy it will not be re-checked and will always be marked as unhealthy, thus routed for the two-step write process by the controller 602 (FIG. 6).

More than one level of "healthy" MLC blocks are also contemplated. Although a single threshold for BER has been mentioned above, where MLC blocks are either healthy if they have a BER below the threshold and are otherwise marked unhealthy, there may be finer granularity marking of healthy blocks. Using the BER for a block as the measure of block health, a healthy block may be set at a BER threshold that is well within the ability of the ECC engine in the controller to correct, while an unhealthy block may be one that is still within the ability of the ECC engine 124 (FIG. 2A) to correct, but has a BER that would indicate a higher likelihood of write errors occurring that would take up more resources more time consuming error correction processes. Unhealthy blocks, as referred to herein, are still usable blocks that are capable of holding data within the correctable error capability of the ECC engine 124. An unhealthy block in this disclosure refers to a still usable block but that is riskier due to the higher BER measured, and thus differs from a bad block designation where the block is considered unusable and is removed from the usable block pool. An unhealthy block has a higher BER than the predetermined healthy block threshold and so is considered having a higher risk of write errors such that writes to the unhealthy block may be routed indirectly via a first SLC write to an SLC block and a subsequent folding operation where the data from that SLC block and others are written into the unhealthy MLC block.

With respect to different granularities of healthy blocks, multiple levels of healthy nay be designated based on any number of additional thresholds of BER. For example, if a hypothetical non-volatile memory system 100 includes an ECC engine 124 capable of correcting up to 120 errors, and the predetermined threshold BER for identifying healthy blocks is set at 60 errors, then any block measured to have a BER of less than 60 errors in the process of FIG. 7 may be marked healthy, and blocks with 60 or greater bit errors measured would be labeled as unhealthy blocks, or in instances where a bad block is defined to be one with 100 or more bit errors, an unhealthy block that is usable with the two step SLC write and SLC-MLC fold may be defined as those blocks with a measured BER of 60-99 bit errors. To provide the higher granularity of health rankings in the healthy blocks, the BER range of 0-59 bit errors in this example may be further subdivided into predetermined smaller ranges, where a highest health rating is assigned to MLC blocks with a measured BER of 0-9 errors, a second highest health rating may be assigned to MLC blocks with 10-19 bit errors measured, and so on up to a least healthy rating subset of the healthy blocks, for example MLC blocks with 50-59 measured bit errors. The number of bit errors and the ranges presented above are simply one possible arrangement and any of a number of other thresholds and ranges are also contemplated. The health rantings may be subdivided in any number of categories, with even or uneven groupings of BER, in different embodiments.

The MLC block health ratings table 117 or other data structure may be modified to include a numerical or other rating in addition to the healthy rating marking. Also, the different ratings of health within the class of MLC blocks marked as healthy may correspond to different predetermined numbers of write cycles before re-checking the health of the MLC blocks. As an example, for MLC blocks identified in the healthiest group (0-9 errors in the above example) the direct MLC write cycle number assigned to those blocks might be six, where blocks in that healthiest subgroup of 0-9 bit errors may be written to directly and erased six times before a next block health check is performed using a two-step write to SLC and SLC to MLC fold to write to that MCL block. The MLC direct write number may progressively decrease for each progressively less healthy group of healthy MLC blocks, where MLC blocks in the 10-19 error range are assigned a direct MLC write cycle number of 5, blocks in the 20-29 error subgroup assigned a direct MLC write cycle number of 4 and so on. Again, the example above is just one possible arrangement of health levels and corresponding MLC direct write cycles before next health check numbers. Other combinations are contemplated.

In yet additional implementations, the determination of health of MLC blocks and the subsequent selection for each MLC block of a direct write versus two-step SLC write and SLC-MLC fold may be applied at a finer resolution than just the MLC block level. In one implementation, the unhealthy blocks may be grouped into subcategories of partially safe unhealthy blocks, the number of word line failures is less than a first threshold, and unsafe blocks, where the number of word line failures is greater than or equal to the threshold failure number. An example of a threshold separating unhealthy blocks that are partially safe from unhealthy blocks that are unsafe may be that unhealthy blocks having a word line failure rate of less than 20% may be identified by the controller 102 as partially safe unhealthy MLC blocks and those unhealthy blocks with a word line failure rate greater than or equal to 20% are labeled unsafe unhealthy MLC blocks. The failure of a word line in a block may be defined as a word line having too many bit errors to be corrected by the ECC engine 124 of the controller 102. The 20% word line failure rate threshold dividing between partially safe unhealthy blocks and unsafe unhealthy blocks is just one example threshold. Any of a number of other thresholds are contemplated. For example, a threshold in the range of 40%-50% of word line failures may be selected as the dividing line between partially safe unhealthy blocks and unsafe unhealthy blocks.

Figure 9:
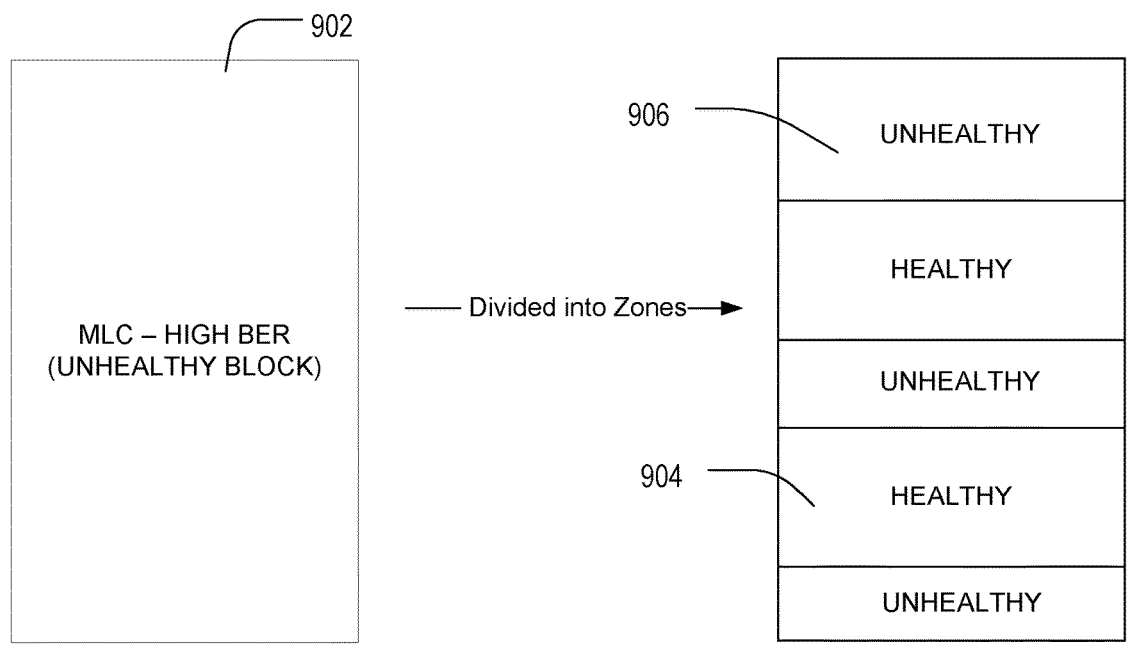
FIG. 9 illustrates an example of further dividing an unhealthy MLC block into health and unhealthy portions.

Referring to FIG. 9, when an otherwise (by BER) unhealthy MLC block 902 is found to have less than the predetermined number of word lines that have had failed writes, where a failed write may be defined as uncorrectable ECC errors where the number of errors detected in the word line by the ECC engine 124 exceeds the capability of the ECC engine 124 to correct, but other of the word lines individually have a BER that is within the one or more predetermined healthy thresholds, then an additional variation on the technique for assigning the appropriate write path to MLC blocks may be used. Referring to FIG. 9, in this variation on the treatment of unhealthy blocks, instead of an entire MLC block 902 being labeled as simply unhealthy, where the write path or paths for data assigned by the controller 602 is the same for the entire unhealthy MLC block, different zones or portions of a single MLC block 902 may be designated a healthy portion 904 or an unhealthy portion 906 such that data may be routed differently to each portion of the MLC block based on that portion's individual health rating. In this implementation, the health of portions 904, 906 of a MLC block 902 may be stored in the MLC block health ratings table 117 for the MLC block 902. Each portion 904, 906 may be separately tracked and acted on. Each of the healthy portions 904 and unhealthy portions 906 of the MLC block 902 are preferably measured in whole number increments of word lines making up the block 902.

In one implementation, each block 902 may be divided into multiple healthy 904 and unhealthy 906 portions where all the word lines in each healthy portion will be written to directly and all the word lines in each unhealthy portion will be written to with back up (e.g. first to SLC then a SLC-MLC fold so a backup is left in SLC). The word lines are assessed for BER and marked as unhealthy or healthy based on the predetermined BER threshold used on the block level as in the implementations discussed above. There may be multiple healthy portions 904 in a single block 902 where the health of one healthy portion is greater than that of another healthy portion. Thus, the number of predetermined program/erase cycles assigned before needing to recheck block health differ between the different healthy portions 904. In one implementation the different portions of the block 902 may be tracked independently, however the number of predetermined program/erase cycles before rechecking block health for the block containing those different portions may be defined by the least healthy of the healthy portions. In other words, the predetermined number of program/erase cycles for which a block can be safely used before a health recheck may be set by the healthy portion 904 assigned the minimum predetermined number of program erase cycles in the block. For example, if a block has 3 portions, 2 healthy and 1 unhealthy, and the safe cycles assigned to the healthy portions are 5 and 10, respectively, then the block may be programmed and erased 5 times without rechecking the BER for healthy portions. After that fifth program and erase cycle, the controller may check the BER again for 1$^{st}$ healthy portion 904 (assigned 5 cycles) to determine if it remains healthy or needs to be divided into healthy and unhealthy sub portions. The 2nd healthy portion (originally assigned 10 cycles) may still be used for 5 more cycle before needing to recheck BER. The unhealthy portion of that block 902 generally remains unhealthy, but the BER for that unhealthy portion may be checked after every cycle to see if the SLC backup copy is required or not.

Figure 10:
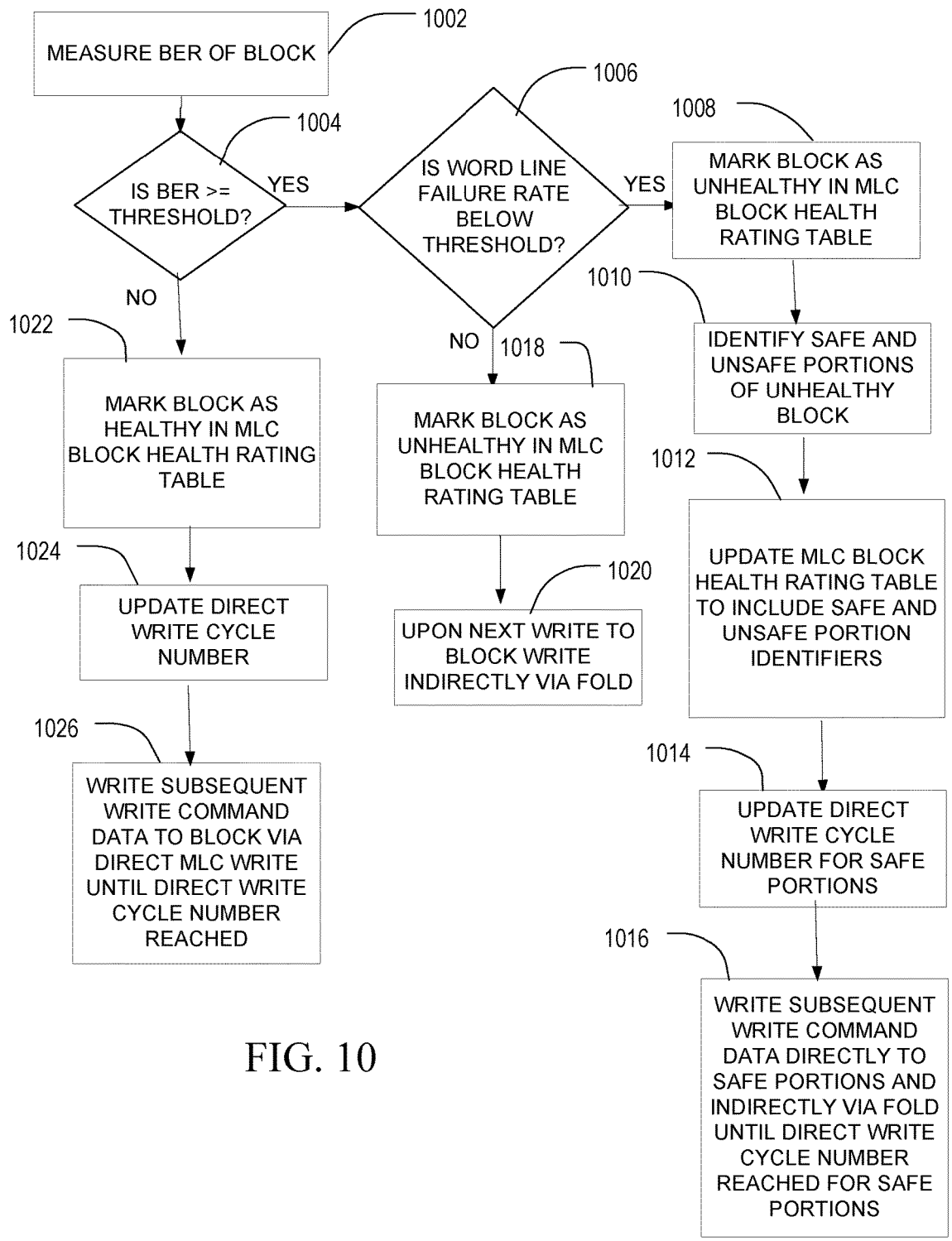
FIG. 10 is a flow diagram of an alternative implementation of the method of FIG. 8 that includes writing over different write paths to entire blocks or to divided blocks as illustrated in FIG. 9.

Referring now to FIG. 10, a variation on the processes of FIGS. 7 and 8 is shown that incorporates a version of subdividing unhealthy blocks into partially safe unhealthy blocks that have some portions written to directly and some portions written to via folding from SLC blocks, and into generally unsafe blocks where all writes to the block are done via folding from SLC. When a MLC block is first selected and its health has not been measured, the controller 102 measures the health of the block, for example by measuring the BER for the block (at 1002). If the individual word line failure rate is below a threshold, for example less than a fixed percentage of the word lines have failed as noted above, then the block is both marked as unhealthy and the controller 102 also identifies and stores identifiers for the safe portions and unsafe portions of that block in the MLC block health rating table 117 in volatile memory 126 (at 1008, 1010 and 1012). A direct write cycle number is assigned to the safe portions indicating the number of times that safe portion may be written to directly before rechecking the health of the block. (at 1014). Data for subsequent write commands that come in that the controller selects the MLC block for will then have the data written in direct MLC writes to the safe portions of the block, the unsafe portions identified for that block will have data routed via the two-step write process including a SLC write and an SLC-MLC fold. This write pattern to that MLC block will repeat until the direct write cycle number for the block has been reached (at 1016). The health of the block will then be re-checked via the indirect two-step write process as described previously the next time the block is selected as the destination for another data write. In one implementation, each safe portion of the MLC block may be assigned a same direct write cycle number.

When the BER measured for a block (at 1002) indicates a BER greater than or equal to the threshold for identifying unhealthy blocks (at 1004) and has a word line failure rate greater than the word line failure threshold (e.g. 20%) (at 1006), then the controller will mark the block as unhealthy and subsequent writes may all be written to the block via the indirect, two-step write that includes a SLC-MLC fold (at 1018, 1020). Similarly, as discussed previously, the measured BER is less than the BER threshold (at 1004), then the controller will mark the block as healthy in the MLC block health rating table 117 and assign a direct MLC write cycle number to the block (at 1024). Subsequent write commands where the controller selects the MLC block will be routed for direct MLC writes to the MLC block until the number of completed program/erase cycles has reached the assigned direct MLC write number and a re-check of the health is triggered for the next write command (at 1026).

Figure 11:
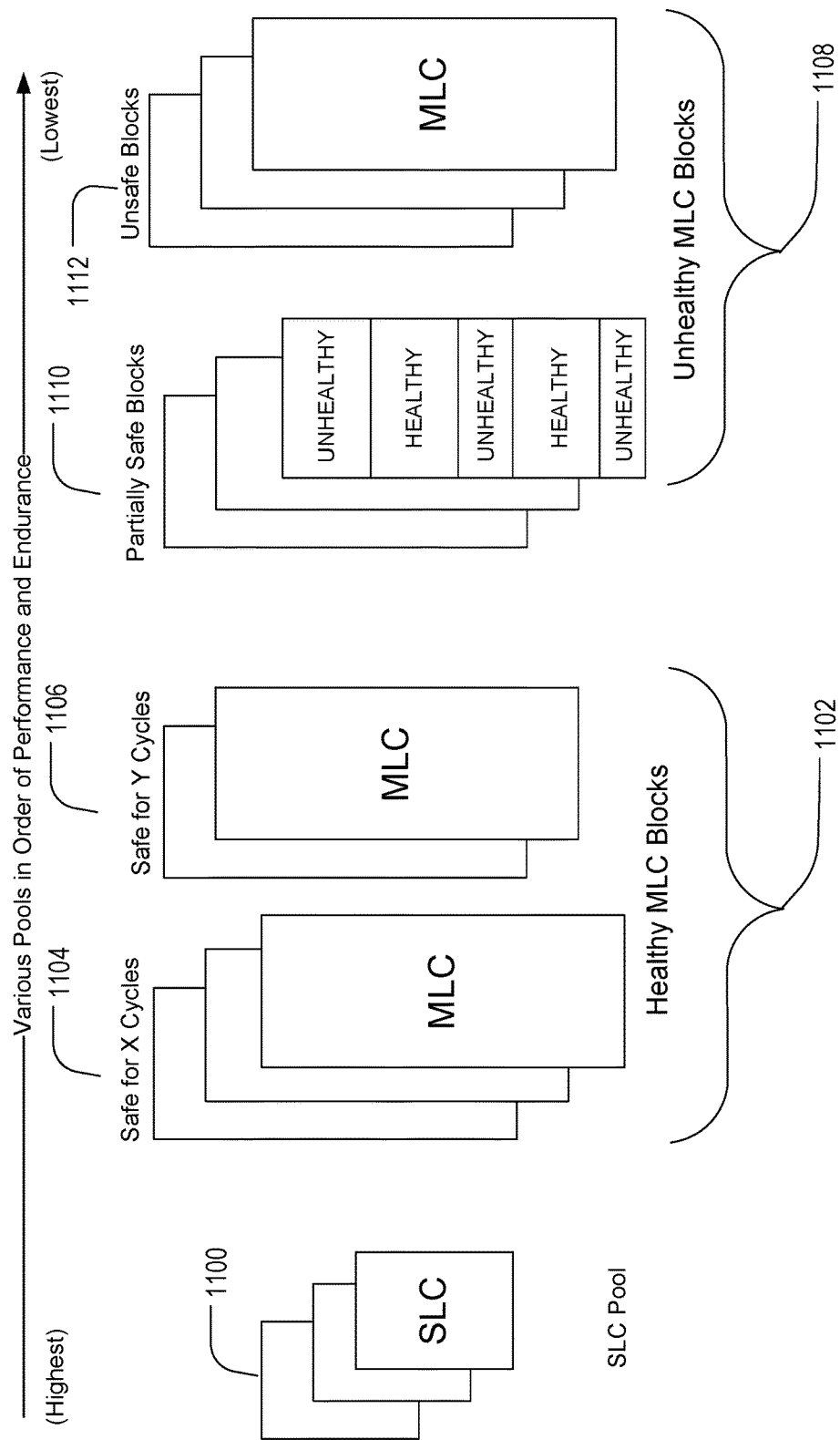
FIG. 11 illustrates different block types in a non-volatile memory in order by relative performance and endurance.

In FIG. 11, example blocks in a non-volatile memory, from highest endurance and performance to lowest endurance and performance, are illustrated. The SLC blocks 1100 are generally considered the highest performance and endurance blocks. As discussed above, MLC blocks having less than a threshold BER are considered the healthy blocks 1102 and may be further subcategorized within the healthy block category by relative BER groupings into those MLC blocks safe for "X" cycles 1104 before rechecking the block health and those considered safe for "Y" cycles 1106 before re-checking the block health, where X>Y. Two subcategories of healthy MLC blocks 1102 are illustrated, however any number of subcategories are contemplated. Optionally, MLC blocks having greater than the threshold BER that are then considered the unhealthy blocks 1108 may be further subcategorized. The unhealthy blocks may be segregated into partially safe blocks 1110 representing those unhealthy blocks having less than a threshold number of failed word lines and/or less than a first unhealthy BER threshold, and unsafe blocks 1112 which are those unhealthy blocks having greater than the threshold number of failed word lines and or greater than the first unhealthy BER threshold. As noted above the controller 102 may direct data to the partially safe blocks 1110 over different write paths (direct MLC write and two-step SLC write and SLC-MLC fold) directed to different portions of the same partially unsafe block, while the entirety of other of the unsafe blocks 1112 that have the higher BER and/or higher word line failure may only receive data over the two step write path via the SLC blocks.

In one implementation, the controller 102, via the MLC write health module 112, may preferentially select the available MLC blocks for data writes in order of greatest performance and endurance rankling, for example as shown in FIG. 11. Thus, healthy MLC blocks 1102 would be chosen over unhealthy MLC blocks 1108, and within the healthy MLC blocks 1102, the healthiest subset 1104 would be selected over the next healthiest subset 1106. Similarly, if no healthy blocks 1102 were available, the controller may preferentially select the partially safe blocks 1110 of the unhealthy MLC block pool 1108 over the unsafe blocks 1112. The controller may utilize the MLC block health rating table to make a determination of relative block health when a write command comes in. The MLC block health rating table 117 may be periodically stored in non-volatile memory 104 and all or a portion of the table data copied into volatile memory 116 as needed so that the MLC block health rating table 117 may persist after the NVM system 100 is powered down.

The writing of data to blocks (or portions of blocks) that are deemed to be usable but unhealthy does not need to be sequential. In the examples of FIGS. 7 and 8, a method was described where the controller only made direct MLC writes of data received at the NVM system 100 when the selected destination MLC block had been identified as healthy. In contrast, the MLC blocks deemed unhealthy were only written to in an SLC-MLC fold operation after data received at the NVM system had first been written to SLC blocks. In an alternative implementation, the writing of data to a MLC block determined to be unhealthy may include concurrent writes of the same data directly to the unhealthy MLC block and to SLC blocks.

Thus, referring again to FIG. 6, instead of only indirectly writing received data through a two-step, sequential process of first writing to SLC 604 and then folding that data from SLC to the unhealthy MLC block over the folding path 612, in this alternative embodiment the data may be concurrently written directly to the unhealthy MLC block 606 over the direct MLC write path 608 and to the SLC blocks over the SLC write path 610. This alternative embodiment varies from the sequential write examples of FIG. 7 (at 708) and FIG. 8 (at 806 and 808) in that data reaching the NVM system 100 is concurrently directly written to SLC blocks and to the unhealthy MLC blocks, rather than having the data first pass through the SLC blocks. The determination of MLC block health using BER as the criterion, and the assignment of the predetermined number of direct MLC write operations for healthy blocks (or healthy portions of unhealthy blocks) in this alternative concurrent SLC and MLC write approach for unhealthy MLC blocks may be the same as discussed above. The BER may be checked by the controller based on errors detected during the direct write to the unhealthy MLC block in this alternative implementation.

The sequential approach to backing up the data via a first SLC write operation and then writing that data from the SLC blocks to the unhealthy MLC block in a fold operation may provide a better burst write performance because the NVM system can use the higher write speed generally available in SLC blocks and later fold the data to the MLC block in a background operation. In one implementation, a background operation may be defined as an operation that executes in the NVM system when no host command is pending. The alternative approach of concurrently writing data directly to the unhealthy MLC blocks and to the SLC blocks may be desirable in memory systems that do not require a higher burst write speed. Either approach provides a back-up copy of the data in SLC that may be utilized to recover the data if the write into the unhealthy MLC block subsequently fails, for example if the write into the unhealthy MLC block results in an uncorrectable ECC error.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two-dimensional memory structure or a three-dimensional memory structure.

In a two dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three-dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two-dimensional and three-dimensional exemplary structures described but cover all relevant memory structures within the spirit and scope of the invention as described herein and as understood by one of skill in the art.

Methods and systems have been disclosed for managing received data and, based on determined block health of MLC blocks, either directly writing data to healthy blocks, or writing first to SLC blocks and then folding to MLC blocks in the case of unhealthy MLC blocks. The system and method permit a non-volatile memory system to obtain faster performance for healthy blocks and utilize a more circuitous, but safer in terms of data backup in case of write errors, data write path for unhealthy blocks. The system and method may use a BER threshold to differentiate healthy from unhealthy MLC blocks. Healthy blocks may be subdivided into subgroups based on relative BER, where the lowest BER healthy blocks may be used for direct MLC writes for a greater number of program/erase cycles before re-checking BER than healthy blocks with higher measured BER. Unhealthy MLC blocks may be treated uniformly, where all writes to an unhealthy MLC block include a write to a SLC block as a back-up in case of corruption or failure in the unhealthy MLC block. The writing of data to an unhealthy MLC block may be via a two-step write: first to SLC and then a fold from SLC to MLC, or via concurrent direct writes to both an SLC block and the unhealthy MLC block. Alternatively, for certain unhealthy blocks, different portions of an unhealthy block may be treated differently, where healthy word lines may be written to directly and unhealthy word lines are written to in the two-step SLC write, SLC to MLC fold process. The subdivision of unhealthy blocks may be made on the basis of a word line failure percentage for the unhealthy block and/or on a finer BER thresholding within the BER range that is predetermined to identify an unhealthy MLC block.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A non-volatile memory system comprising:
 a non-volatile memory having a plurality of single level cell (SLC) blocks having single bit per cell capacity memory cells, and a plurality of multi-level cell (MLC) blocks having multiple bit per cell capacity memory cells;
 a controller in communication with the non-volatile memory, the controller configured to:
  identify which of the plurality of MLC blocks are healthy MLC blocks and which are unhealthy MLC blocks based on a health criterion;
  write received host data to MLC blocks previously identified as healthy over a direct MLC write path that bypasses the SLC blocks; and
  write received host data to MLC blocks previously identified as unhealthy over a multi-step write path via an initial write to at least one SLC block, wherein healthy MLC blocks comprise MLC blocks having the health criterion within a first predetermined range and unhealthy MLC blocks comprise MLC blocks having the health criterion in a second predetermined range different than the first predetermined range.

2. The non-volatile memory system of claim 1, wherein the health criterion is a bit error rate (BER) of an MLC block.

3. The non-volatile memory system of claim 2, wherein the controller is further configured to, upon receipt of data from a host, select an available MLC block in the non-volatile memory based on a health rating of the available MLC block in a block health rating data structure in the non-volatile memory system.

4. The non-volatile memory system of claim 3, wherein the controller is further configured to select an available MLC block identified as healthy in the block health rating data structure and, when there is no available MLC block identified as healthy in the block health rating data structure, the controller is configured to select an available MLC block identified as unhealthy.

5. The non-volatile memory system of claim 3, wherein the controller is further configured to, when an available MLC block is not listed in the block health rating data structure:
 indirectly write the received host data to the available MLC block over the multi-step write path;
 measure the BER of the available MLC block; and
 update the block health rating data structure with a health of the available MLC block based on the measured BER.

6. The non-volatile memory system of claim 5, wherein the controller is further configured to, when the available MLC block is determined to be a healthy MLC block, associate a direct write cycle number with the healthy MLC block in the block health rating data structure.

7. The non-volatile memory system of claim 6, wherein the controller is configured to associate different direct write cycle numbers based on how much less than a predetermined BER threshold the measured BER is for the available MLC block.

8. The non-volatile memory system of claim 5, wherein when the measured BER of the available MLC block is in the second predetermined range and when the available MLC block meets a second health criterion, the available MLC block is a partially safe unhealthy block, and the controller is further configured to:
 update the block health rating data structure to identify healthy portions of the partially safe unhealthy block and unhealthy portions of the partially safe unhealthy block.

9. The non-volatile memory system of claim 8, wherein when the second health criterion is a number of failed word lines in the available MLC block that is less than a predetermined failed word line threshold, and a failed word line comprises a word line determined to have a number of bit errors that is uncorrectable for the non-volatile memory system.

10. The non-volatile memory system of claim 9, wherein the healthy portions and the unhealthy portions of the partially safe unhealthy block comprises respective groups of word lines, and where each group of word lines having a BER less than a predetermined BER threshold is identified by the controller as a healthy portion and each group of word lines having a BER greater than or equal to the predetermined BER threshold is identified as an unhealthy portion.

11. The non-volatile memory system of claim 8, wherein when the partially safe unhealthy block is selected for a subsequent write operation, the controller is configured to:
 write received host data to each healthy portion over the direct MLC write path that bypasses the SLC blocks; and
 write received host data to each unhealthy portion over the multi-step write path via the initial write to the at least one SLC block.

12. A non-volatile memory system comprising:
 a non-volatile memory having:
  a plurality of single level cell (SLC) blocks having single bit per cell capacity memory cells;
  a plurality of multi-level cell (MLC) blocks having multiple bit per cell capacity memory cells; and
  a block health rating data structure having MLC block health data for at least a portion of the plurality of MLC blocks; and
 means for writing host data to MLC blocks already identified as healthy in the block health data structure prior to receiving host data over a direct MLC write path that bypasses the SLC blocks, and for writing host data to MLC blocks already identified as unhealthy in the block health rating data structure prior to receiving the host data over a multi-step write path via an initial write to at least one SLC block, wherein healthy MLC blocks comprise MLC blocks having a health criterion within a first predetermined range and unhealthy MLC blocks comprise MLC blocks having the health criterion in a second predetermined range different than the first predetermined range.

13. A non-volatile memory system comprising:
 a non-volatile memory having a plurality of single level cell (SLC) blocks having single bit per cell capacity memory cells, and a plurality of multi-level cell (MLC) blocks having multiple bit per cell capacity memory cells; and
 a controller in communication with the non-volatile memory, the controller configured to:
  receive data for storage in the non-volatile memory;
  determine from a previous block health criterion measurement whether a MLC block in the plurality of MLC blocks in the non-volatile memory meets a health criterion level;
  when the MLC block, based on the previous block health criterion measurement, meets the health criterion level, directly write the received data to the MLC block; and
  when the MLC block, based on the previous block health criterion measurement, does not meet the health criterion level:
   write the received data in a SLC block of the plurality of SLC blocks; and
   write the received data to the MLC block.

14. The non-volatile memory system of claim 13, wherein the health criterion level comprises a bit error rate (BER) less than a predetermined amount.

15. The non-volatile memory system of claim 14, wherein to write the received data in the SLC block and also write the received data to the MLC block, the controller is further configured to:
 write the received data to the SLC block concurrently with directly writing the received data to the MLC block.

16. The non-volatile memory system of claim 13, wherein to write the received data in the SLC block and also write the received data to the MLC block, the controller is further configured to:
 write the received data first to the SLC block and then write the received data from the SLC block to the MLC block.

17. The non-volatile memory system of claim 16, wherein when no health criterion has previously been measured for the MLC block, the controller is further configured to:
   write the received data to the SLC block;
   write the received data from the SLC block to the MLC block; and
   measure the health criterion for the MLC block during the writing of the received data from the SLC block to the MLC block.

18. The non-volatile memory system of claim 17, wherein to measure the health criterion, the controller is configured to measure a bit error rate (BER) of the MLC block.

19. The non-volatile memory system of claim 18, wherein the controller is further configured to mark the MLC block as a healthy block in a block health rating data structure when the measured BER for the MLC block is less than a predetermined threshold.

20. The non-volatile memory system of claim 19, wherein to mark the MLC block as a healthy block the controller is further configured to:
   associate a direct write cycle number with the MLC block in the block health rating data structure, the direct write cycle number representing a number of writes to the MLC block until the health criterion for the MLC block is to be measured again.

21. The non-volatile memory system of claim 20, wherein to mark the MLC block as a healthy block the controller is further configured to:
   associate one of a plurality of direct write cycle numbers with the MLC block based on how much less the measured BER for the MLC block is than the predetermined threshold.

* * * * *